US012801194B2

(12) United States Patent
Zou

(10) Patent No.: US 12,801,194 B2
(45) Date of Patent: Nov. 17, 2026

(54) ELECTRONIC DEVICE WITH SEALED AIR EXHAUST VENT CHANNEL FOR HEAT DISSIPATION

(71) Applicant: Huawei Technologies Co., Ltd., Shenzhen (CN)

(72) Inventor: Liujun Zou, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 185 days.

(21) Appl. No.: 18/640,791

(22) Filed: Apr. 19, 2024

(65) Prior Publication Data

US 2024/0264646 A1 Aug. 8, 2024

Related U.S. Application Data

(63) Continuation of application No. PCT/CN2022/124522, filed on Oct. 11, 2022.

(30) Foreign Application Priority Data

Oct. 21, 2021 (CN) ........................ 202111226241.4

(51) Int. Cl.
*G06F 1/20* (2006.01)
*H05K 7/20* (2006.01)

(52) U.S. Cl.
CPC ......... *G06F 1/203* (2013.01); *H05K 7/20145* (2013.01); *H05K 7/20154* (2013.01)

(58) Field of Classification Search
CPC .. G06F 1/203; G06F 1/16; G06F 1/20; H05K 7/20145; H05K 7/20154; Y02D 10/00
See application file for complete search history.

(56) References Cited

U.S. PATENT DOCUMENTS 8,926,414 B1 * 1/2015 Kirkpatrick ............. G06F 1/203 361/679.41
9,829,924 B2 * 11/2017 Shin ...................... G06F 1/1656
9,927,841 B2 * 3/2018 Gheorghiu .......... E05D 11/0054
10,178,797 B1 * 1/2019 Lau ........................... G06F 1/20
10,248,167 B1 * 4/2019 Huang .................. G06F 1/1656
10,921,062 B2 * 2/2021 Yang .......................... F04D 1/04
11,262,821 B1 * 3/2022 North .................... G06F 1/3296
(Continued)

FOREIGN PATENT DOCUMENTS

CN 102958324 A 3/2013
CN 103491747 A 1/2014
(Continued)

*Primary Examiner* — Rockshana D Chowdhury
(74) *Attorney, Agent, or Firm* — Conley Rose, P.C.

(57) ABSTRACT

An electronic device includes a fan, a housing, a heat dissipation assembly, and a heat emitting component. The fan, the heat dissipation assembly, and the heat emitting component are disposed in the housing. The fan includes a first side plate and a second side plate. The fan is coupled to the housing through the first side plate and the second side plate. The first side plate, the second side plate, the housing, and the heat dissipation assembly enclose an air outlet channel, and the air outlet channel couples with an air outlet of the fan and an air exhaust vent of the housing. The first side plate and the second side plate are coupled to the housing such that the first side plate and the second side plate can seal a side gap of the air outlet channel.

20 Claims, 12 Drawing Sheets

(56) References Cited

U.S. PATENT DOCUMENTS

| | | | | |
|---|---|---|---|---|
| 12,130,668 | B2 * | 10/2024 | Liu | G09F 9/301 |
| 2002/0062650 | A1 * | 5/2002 | Dukhan | H05K 7/20145 62/324.2 |
| 2003/0114099 | A1 * | 6/2003 | Voorhies | H05K 7/20145 454/184 |
| 2003/0124971 | A1 * | 7/2003 | Williams | G06F 1/20 454/184 |
| 2003/0153259 | A1 * | 8/2003 | Lee | H05K 7/20172 454/184 |
| 2004/0150952 | A1 * | 8/2004 | Yu | H05K 7/20154 257/722 |
| 2009/0046426 | A1 | 2/2009 | Ishikawa | |
| 2012/0100794 | A1 * | 4/2012 | Redshaw | G06F 1/206 454/184 |
| 2012/0175079 | A1 | 7/2012 | Chang | |
| 2013/0327507 | A1 * | 12/2013 | Degner | H05K 7/2039 361/695 |
| 2013/0329357 | A1 * | 12/2013 | Degner | B23P 15/26 165/104.21 |
| 2013/0329368 | A1 * | 12/2013 | Degner | F28D 15/0275 165/185 |
| 2016/0088769 | A1 * | 3/2016 | Hsiao | G06F 1/203 165/104.26 |
| 2017/0108901 | A1 * | 4/2017 | Huang | G06F 1/185 |
| 2018/0070472 | A1 * | 3/2018 | Aiello | F04D 17/16 |
| 2019/0021184 | A1 * | 1/2019 | Williams | F04D 25/0613 |
| 2019/0278338 | A1 * | 9/2019 | Siddiqui | G06F 1/1656 |
| 2020/0159296 | A1 * | 5/2020 | Zhu | H05K 7/20145 |
| 2020/0245498 | A1 * | 7/2020 | Wu | H05K 7/20145 |
| 2020/0249717 | A1 * | 8/2020 | Shibayama | G06F 1/1652 |
| 2020/0363843 | A1 * | 11/2020 | Cheng | G06F 1/1681 |
| 2021/0072805 | A1 * | 3/2021 | He | H05K 7/20145 |
| 2021/0219457 | A1 * | 7/2021 | Wong | H05K 7/20145 |
| 2023/0066801 | A1 * | 3/2023 | Lin | G06F 1/1656 |
| 2023/0122743 | A1 * | 4/2023 | Lee | G02B 7/008 361/707 |
| 2023/0171917 | A1 * | 6/2023 | Wang | G06F 1/20 |
| 2023/0195167 | A1 * | 6/2023 | Jung | G06F 1/1624 455/575.4 |
| 2023/0221781 | A1 * | 7/2023 | Carver | G06F 1/20 361/127 |
| 2023/0397362 | A1 * | 12/2023 | Yang | G06F 1/203 |
| 2024/0074028 | A1 * | 2/2024 | Yoon | G02B 27/01 |
| 2024/0094547 | A1 * | 3/2024 | Dunsmoor | H05K 7/20209 |
| 2024/0142942 | A1 * | 5/2024 | North | G05B 19/4155 |
| 2024/0147657 | A1 * | 5/2024 | North | G06F 1/203 |
| 2024/0258610 | A1 * | 8/2024 | Vichare | G06F 1/206 |

FOREIGN PATENT DOCUMENTS

| | | | |
|---|---|---|---|
| CN | 216596066 | U | 5/2022 |
| JP | 2003101272 | A | 4/2003 |

* cited by examiner

ELECTRONIC DEVICE WITH SEALED AIR EXHAUST VENT CHANNEL FOR HEAT DISSIPATION

CROSS-REFERENCE TO RELATED APPLICATIONS

This is a continuation of International Patent Application No. PCT/CN2022/124522 filed on Oct. 11, 2022, which claims priority to Chinese Patent Application No. 202111226241.4 filed on Oct. 21, 2021. The disclosures of the aforementioned applications are hereby incorporated by reference in their entireties.

TECHNICAL FIELD

Embodiments of this disclosure relate to the field of electronic devices, and in particular, to an electronic device.

BACKGROUND

With the development of a lighter and thinner electronic device with higher performance, an integration degree of electronic components continuously increases. Consequently, heat flux density of the electronic devices becomes continuously higher, and a requirement for a heat dissipation capability becomes more demanding. In addition, user requirements for an electronic device gradually become diversified. Some users pursue ultimate performance of the electronic device, which consequently leads to a higher power consumption requirement of a central processing unit (CPU) chip and a higher heat dissipation requirement of the electronic device. A heat dissipation technology used by the electronic device is mainly an air-cooled heat dissipation apparatus that combines a heat dissipation assembly and a fan, which can improve a heat dissipation capability of an entire system. However, an air leakage gap exists in the air-cooled heat dissipation apparatus, which causes an airflow from the fan to flow back to inside the electronic device again. Consequently, heat dissipation of the electronic device is affected. Heat dissipation effect may be reduced if the air leakage gap is not properly blocked. In addition, an internal structure of the electronic device is complex, and the air leakage gap is difficult to be properly blocked. Therefore, a structure of a heat dissipation apparatus needs to be optimized, to improve a heat dissipation capability of the electronic device.

SUMMARY

Embodiments of this disclosure provide an electronic device. An air outlet channel of the electronic device has good sealing performance, which can effectively prevent an airflow generated by a fan from flowing back to inside the electronic device. This improves a heat dissipation capability of the electronic device.

According to a first aspect, an electronic device is provided. The electronic device includes a fan, a housing, a heat dissipation assembly, and a heat emitting component. The fan, the heat dissipation assembly, and the heat emitting component are disposed in the housing. The fan includes an air outlet, a first side plate, and a second side plate. A first end of the first side plate is connected to a first side of the air outlet of the fan, and a second end of the first side plate is connected to a first position of the housing. A first end of the second side plate is connected to a second side of the air outlet of the fan, a second end of the second side plate is connected to a second position of the housing, and the first side and the second side are two opposite sides of the air outlet. An air exhaust vent is provided between the first position and the second position of the housing. An end of the heat dissipation assembly is connected to the heat emitting component. The first side plate, the second side plate, another end of the heat dissipation assembly, and the housing enclose an air outlet channel, and the air outlet channel communicates with the air outlet of the fan and the air exhaust vent.

In this disclosure, a first side plate structure and a second side plate structure are added to the fan, and the first side plate, the second side plate, the heat dissipation assembly, and the housing may enclose the air outlet channel. A side gap of the air outlet channel is sealed due to blockage provided by the first side plate and the second side plate, and the air outlet channel has better sealing performance. Therefore, this effectively prevents air from flowing back to the inside of the electronic device, improves a heat dissipation capability of the electronic device, and improves a running speed of the electronic device. In addition, costs of adding the first side plate and the second side plate are low, and installation difficulty is not increased.

In a possible design, a first convex portion facing the fan is disposed at the first position of the housing, a second convex portion facing the fan is disposed at the second position of the housing, a first concave portion corresponding to the first convex portion is disposed at the second end of the first side plate, and a second concave portion corresponding to the second convex portion is disposed at the second end of the second side plate.

In a possible design, a third concave portion is disposed at the first position of the housing, a fourth concave portion is disposed at the second position of the housing, a third convex portion corresponding to the third concave portion is disposed at the second end of the first side plate, and a fourth convex portion corresponding to the fourth concave portion is disposed at the second end of the second side plate.

In a possible design, the second end of the first side plate is bonded to the first position of the housing, and the second end of the second side plate is bonded to the second position of the housing.

In a possible design, an end that is of the heat dissipation assembly and that is close to the first side plate and the second side plate abuts against the first side plate and the second side plate.

In a possible design, a first filler is disposed in a gap formed by the fan and the housing, and a second filler is disposed in a gap formed by the heat dissipation assembly and the housing.

In this disclosure, fillers are disposed in the gap formed by the heat dissipation assembly and the housing and the gap formed by the fan and the housing, to better seal the air outlet channel. This prevents an airflow from flowing back to the inside of the electronic device from a gap other than a side gap, and therefore improves the heat dissipation capability of the electronic device.

In a possible design, the first filler includes a first end face and a second end face that are opposite to each other, and the first end face of the first filler is in sealing fit with the fan. The second filler includes a third end face and a fourth end face that are opposite to each other, and the third end face of the second filler is in sealing fit with the heat dissipation assembly.

In a possible design, the second end face of the first filler and the fourth end face of the second filler abut against the housing.

In a possible design, materials of the first filler and the second filler are elastic materials.

In a possible design, materials of the first side plate and the second side plate are elastic materials, and the first side plate and the second side plate elastically abut against the first position and the second position respectively.

In this disclosure, the materials of the first side plate and the second side plate are elastic materials. Therefore, elastic forces of the first side plate and the second side plate can ensure that the first side plate is closely attached to the first position of the housing, and the second side plate is closely attached to the second position of the housing. Further, this ensures better sealing performance of the air outlet channel and better heat dissipation effect.

DESCRIPTION OF EMBODIMENTS

The following describes the technical solution in embodiments of this disclosure with reference to accompanying drawings.

The electronic device in this disclosure may be any electronic device in which a heat dissipation apparatus is disposed. For example, the electronic device may be a mobile phone, a tablet, a notebook computer, or a projector. For ease of description, the notebook computer is used as an example in the accompanying drawings in this disclosure. However, this is not limited in this disclosure.

Figure 1:
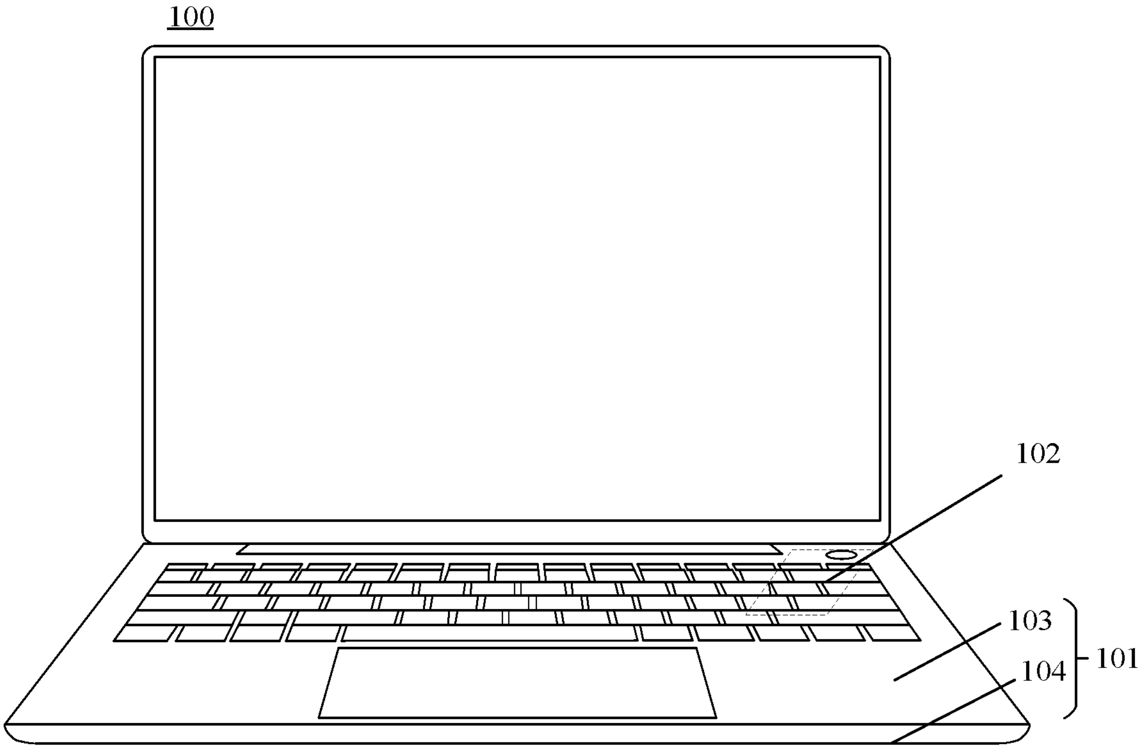
FIG. 1 is a schematic diagram of an electronic device according to this disclosure.

FIG. 1 is a schematic diagram of an electronic device according to this disclosure.

Refer to FIG. 1. The electronic device 100 includes a housing 101 and a heat dissipation apparatus 102, and the housing 101 may form an integral structure having an internal accommodating space. For example, the housing 101 may include a first cover plate 103, a first bottom plate 104, and a side plate. The heat dissipation apparatus 102 is disposed in the accommodating space formed by the housing 101.

Figure 2:
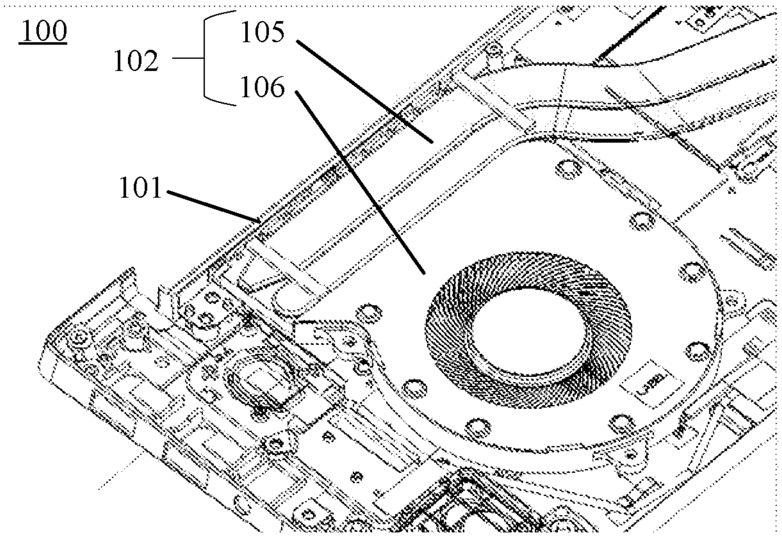
FIG. 2 is a schematic diagram depicting an internal structure of an electronic device.

FIG. 2 is a schematic diagram depicting an internal structure of an electronic device. Refer to FIG. 2. An electronic device 100 includes a heat dissipation apparatus 102, and the heat dissipation apparatus 102 includes a heat dissipation assembly 105 and a fan 106. When the electronic device 100 works, an internal heat emitting component generates heat, and the heat needs to be dissipated from the electronic device in a timely manner to ensure performance of the electronic device. The heat emitting component may be understood as a component that generates heat when the electronic device is running. For example, the heat emitting component of the electronic device may be a processor (or CPU). When the processor runs, heat is generated. Therefore, heat needs to be dissipated from the processor. The electronic device may exhaust, through the heat dissipation apparatus 102, heat generated by the heat emitting component of the electronic device. The heat dissipation apparatus 102 may exhaust hot air in the electronic device through an air exhaust vent on a housing 101.

The heat dissipation assembly 105 may include a heat conducting pipe. The heat conducting pipe may transfer heat from the heat emitting component to the fan 106. The fan 106 exhausts an airflow towards the air exhaust vent that is of the housing 101 and that faces the heat dissipation assembly 105, so that the airflow generated by the fan 106 may transfer heat from the heat dissipation assembly 105 to outside of the electronic device.

Figure 3:
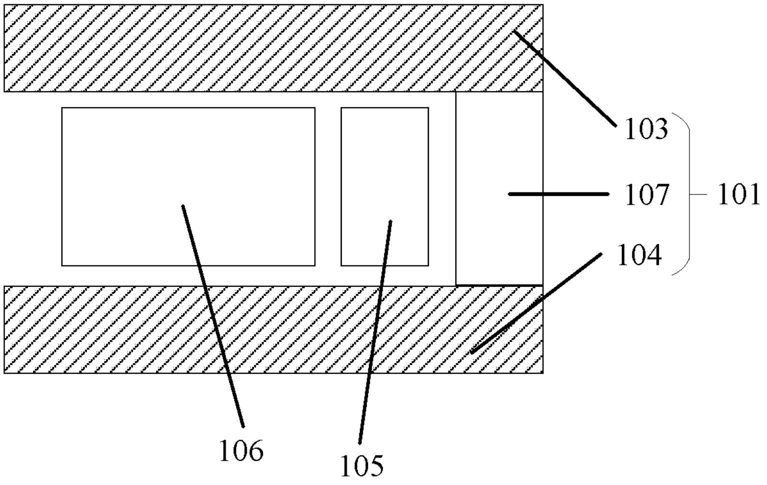
FIG. 3 is a schematic side view of an internal structure of an electronic device.
Figure 4:
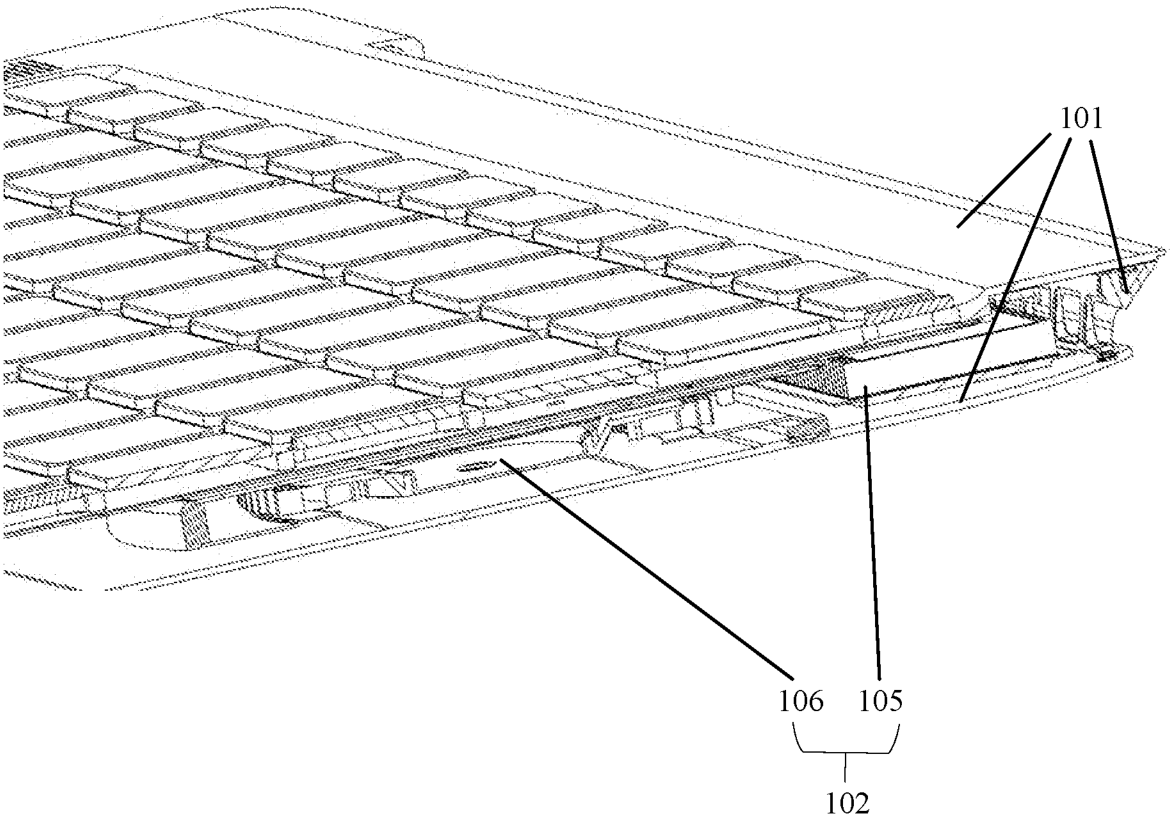
FIG. 4 is a schematic side view of an internal structure of an electronic device.
Figure 5:
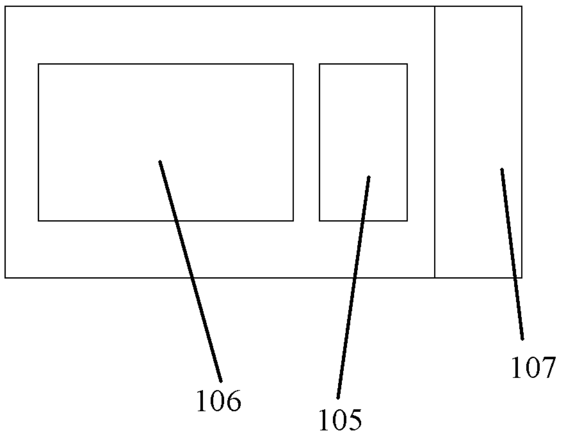
FIG. 5 is a schematic top view of an internal structure of an electronic device.

A gap through which an airflow can pass may exist between the fan 106 and the heat dissipation assembly 105, and a gap through which an airflow can pass may exist between the heat dissipation assembly 105 and the housing 101 of the electronic device. Hot airflows of the electronic device may flow into inside of the electronic device through the gaps, causing poor heat dissipation effect inside the electronic device. FIG. 3 and FIG. 4 are schematic side views of the internal structure of the electronic device. Refer to FIG. 3 and FIG. 4, first side gaps may exist between the fan 106 and the heat dissipation assembly 105 at two sides. Similarly, second side gaps may exist between the heat dissipation assembly 105 and a third side plate 107 of the housing 101 at two sides. FIG. 5 is a schematic top view of the internal structure of the electronic device. With reference to FIG. 5, it can also be learned that a gap exists between the fan 106 and the heat dissipation assembly 105. Similarly, a gap exists between the heat dissipation assembly 105 and the third side plate 107 of the housing 101. In view of an issue that hot air backflow in an electronic device affects overall heat dissipation, this disclosure provides an electronic device, to prevent hot air backflow and improve a heat dissipation capability of the electronic device. In conclusion, the fan and the housing are optimized in this disclosure. To be specific, side plates are added to two sides of an air outlet of the fan, so that the side plates, the housing, and the heat dissipation assembly may enclose an air outlet channel, to prevent hot air from flowing back to the inside of the electronic device through a gap. In addition, the added side plates have simple structures. This can seal a gap in a heat dissipation system of the electronic device, and can improve the heat dissipation capability of the electronic device. In addition, the added side plates have simple structures and are easy to manufacture, which does not cause a large increase in hardware costs and is easy to assemble. Therefore, production efficiency is not affected.

For example, the following describes an electronic device in this disclosure with reference to FIG. 6 to FIG. 21B. It should be understood that, a fan, a heat dissipation assembly, and a housing that are shown in FIG. 6 to FIG. 21B may respectively correspond to the fan, the heat dissipation assembly, and the housing that are shown in FIG. 2. It should be further understood that structures of the components shown in FIG. 6 to FIG. 21B in this disclosure are merely examples for description, and should not constitute a limitation on this disclosure. Any alternative structure falls within the protection scope of this disclosure.

Figure 6:
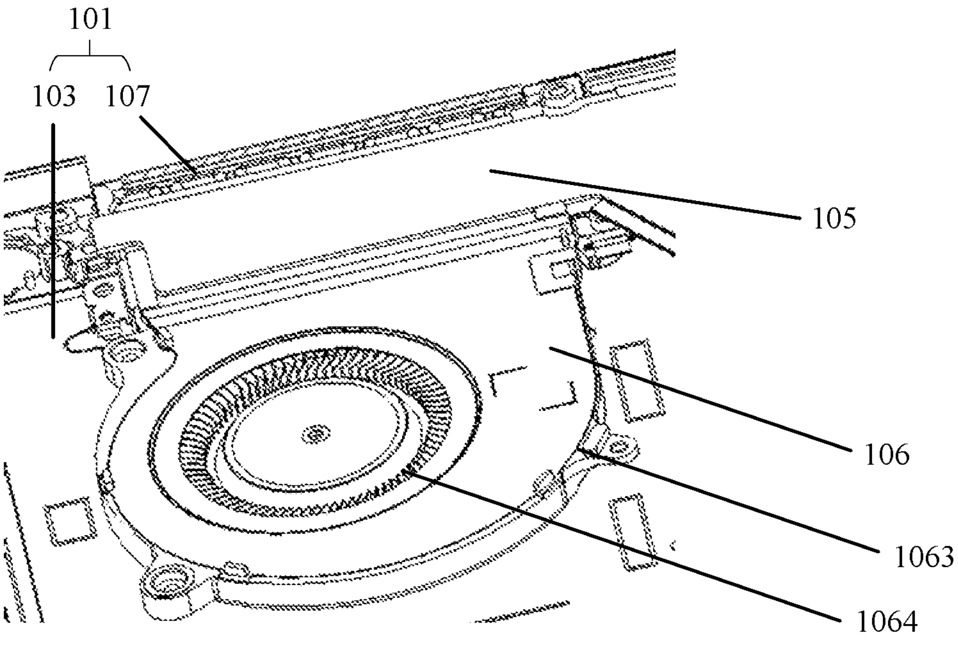
FIG. 6 is a schematic diagram depicting a structure of a local region inside an electronic device according to this disclosure.
Figure 7:
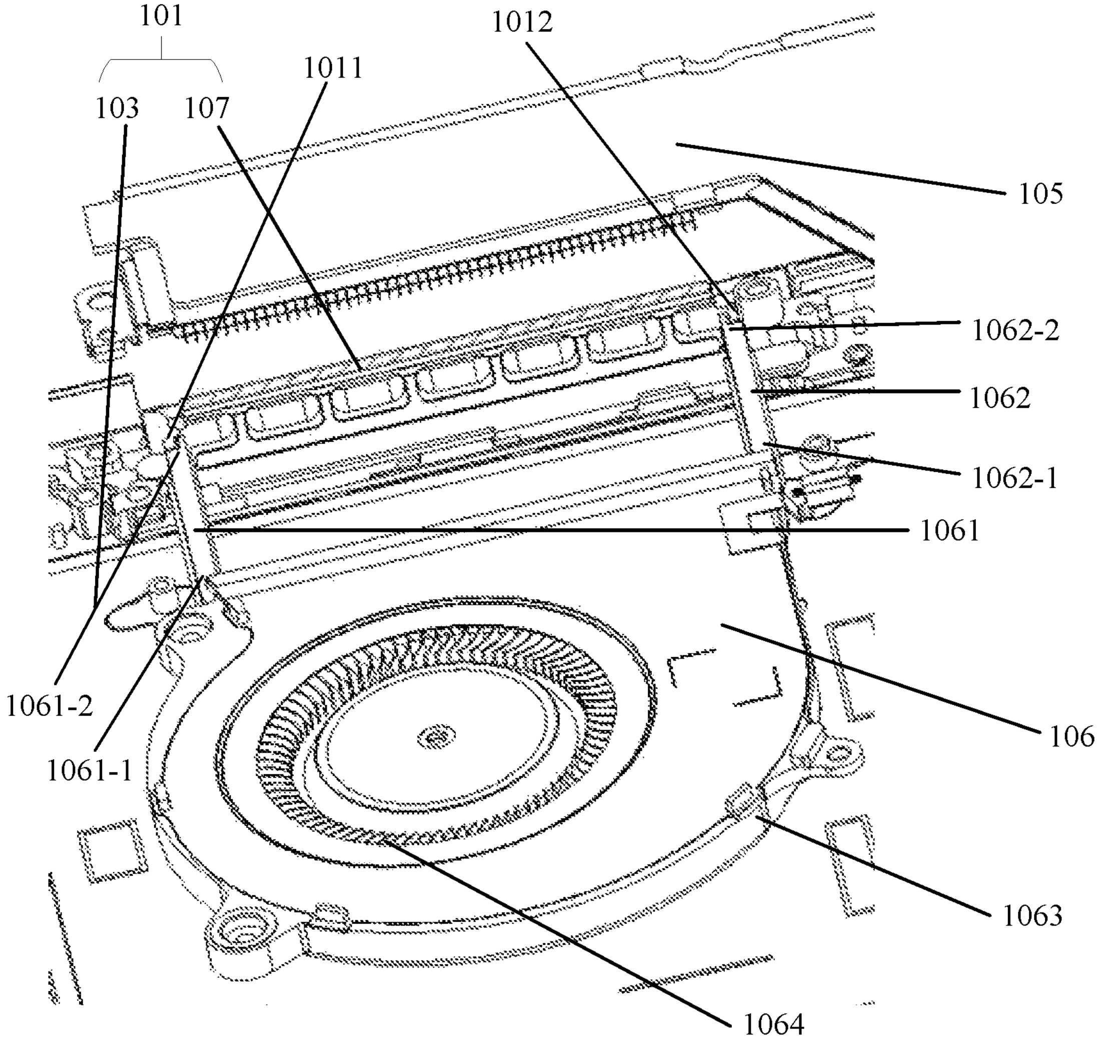
FIG. 7 is a schematic exploded view of a local region inside an electronic device according to this disclosure.

FIG. 6 is a schematic diagram depicting a structure of a local region inside the electronic device according to this disclosure, and FIG. 7 is a schematic exploded view of the local region inside the electronic device according to this disclosure.

Refer to FIG. 6 and FIG. 7. The electronic device includes a housing 101 and a heat dissipation apparatus. The heat dissipation apparatus includes a heat dissipation assembly 105 and a fan 106. The housing 101 may include a first cover plate 103, a first bottom plate, and a third side plate 107. The fan 106 includes an air outlet, a first side plate 1061, and a second side plate 1062.

In some embodiments of this disclosure, the first cover plate 103 and the third side plate 107 may be integrally formed.

In some other embodiments of this disclosure, the first bottom plate and the third side plate 107 may be integrally formed.

Still refer to FIG. 7. An air exhaust vent is provided between a first position 1011 and a second position 1012 of the housing 101. The air exhaust vent is configured to exhaust an airflow generated by the fan 106, so that heat is dissipated to an external space and heat dissipation is implemented. To be specific, the first position 1011 and the second position 1012 are located at two ends on a side that is of the air exhaust vent of the housing 101 and that is close to the fan. In this embodiment of this disclosure, the first position 1011 of the housing 101 is a position at which the housing 101 is connected to the first side plate 1061, and the second position 1012 of the housing 101 is a position at which the housing 101 is connected to the second side plate 1062. For example, refer to FIG. 7. The first position 1011 and the second position 1012 of the housing 101 may be located at two ends on a side that is of the third side plate 107 of the housing 101 and that is close to the fan 106.

Still refer to FIG. 7. The fan 106 is located in an accommodating space formed by the housing 101. For example, the fan 106 may be fastened to the first cover plate 103. The air outlet of the fan 106 faces the air exhaust vent of the housing 101. The fan 106 includes a shell 1063, a fan blade 1064, and a motor. The fan blade 1064 is accommodated in the shell 1063, and the motor may drive the fan blade 1064 to generate an airflow.

Still refer to FIG. 7. The first side plate 1061 and the second side plate 1062 are disposed opposite to each other. The first side plate 1061 of the fan 106 is located on a first side of the air outlet of the fan 106. A first end 1061-1 of the first side plate 1061 is connected to the shell 1063 of the fan 106, and a second end 1061-2 of the first side plate 1061 is connected to the first position 1011 of the housing 101. The second side plate 1062 of the fan 106 is located on a second side of the air outlet of the fan 106. A first end 1062-1 of the second side plate 1062 of the fan 106 is connected to the shell 1063 of the fan 106, and a second end 1062-2 of the second side plate 1062 is connected to the second position 1012 of the housing 101.

Still refer to FIG. 6 and FIG. 7. An end of the heat dissipation assembly 105 may be connected to a heat emitting component, and another end of the heat dissipation assembly 105 may be connected to the first side plate 1061 of the fan 106 and the second side plate 1062 of the fan 106.

Still refer to FIG. 6 and FIG. 7. The first side plate 1061 of the fan 106, the second side plate 1062 of the fan 106, the heat dissipation assembly 105, and the housing 101 may enclose an air outlet channel. The air outlet channel may communicate with each of the air outlet of the fan 106 and the air exhaust vent of the housing 101.

With reference to FIG. 8 to FIG. 21B, the following describes in detail components of the electronic device and connection relationships between the components.

FIG. 8 and FIGS. 9A-9C are schematic diagrams of a structure of the fan according to this disclosure. Refer to FIG. 8 and FIGS. 9A-9C. The fan 106 may include the first side plate 1061, the second side plate 1062, the shell 1063, and the fan blade 1064. The shell 1063 of the fan 106 enables the fan 106 to form an integral structure having an internal accommodating space, and the fan blade 1064 is accommodated in the accommodating space. The first side plate 1061 and the second side plate 1062 are disposed opposite to each other. The first side plate 1061 is located on the first side of the air outlet of the fan 106, and the second side plate 1062 is located on the second side of the air outlet of the fan 106. The first side plate 1061 includes the first end 1061-1 and the second end 1061-2. The first end 1061-1 of the first side plate 1061 is connected to the shell 1063 of the fan 106, and the second end 1061-2 is connected to the first position 1011 of the housing 101. Similarly, the first end 1062-1 of the second side plate 1062 is connected to the shell 1063 of the fan 106, and the second end 1062-2 is connected to the second position 1012 of the housing 101 (refer to FIG. 7).

Figure 8:
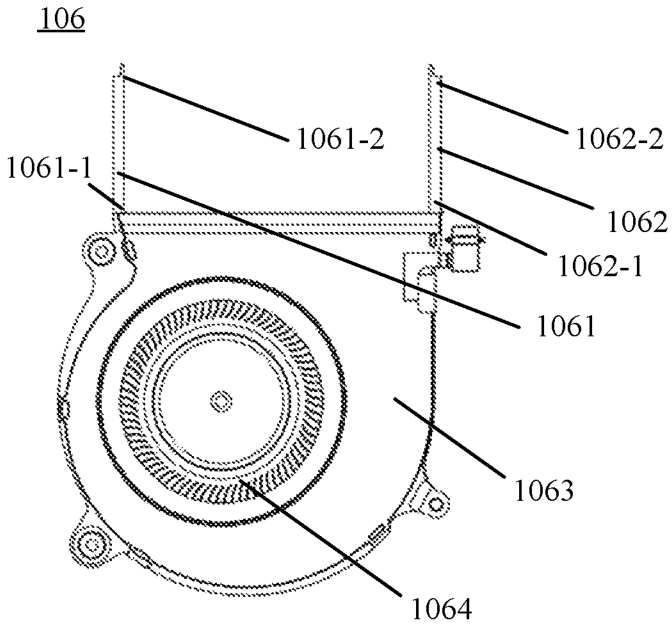
FIG. 8 is a schematic diagram depicting a structure of a fan according to this disclosure.

Refer to FIG. 7 and FIG. 8. The first side plate 1061 and the second side plate 1062 may be further connected to an end of the heat dissipation assembly 105.

Figure 9C:
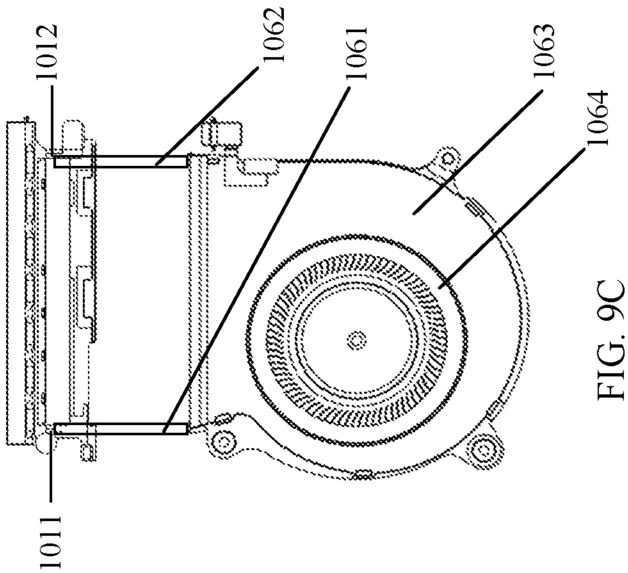
FIG. 9A, FIG. 9B, and FIG. 9C are schematic diagrams depicting a structure of a fan according to this disclosure.
Figure 9B:
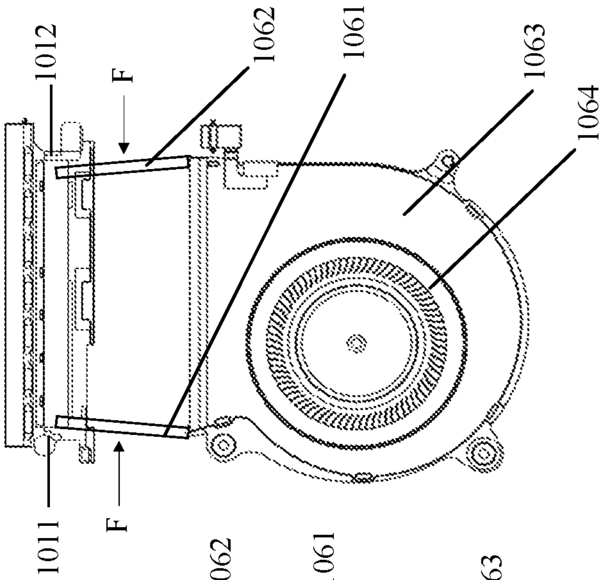
Figure 9A:
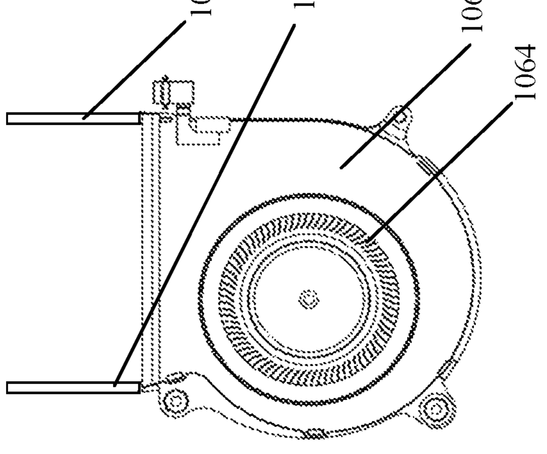

In some embodiments, the first side plate 1061 and the second side plate 1062 may be made of elastic materials. Refer to FIGS. 9A-9C. After a force is applied to each of the first side plate 1061 and the second side plate 1062, each of the first side plate 1061 and the second side plate 1062 may be elastically deformed in a direction of the applied force.

For example, inward forces F are applied in FIG. 9B. In this case, the first side plate 1061 and the second side plate 1062 move inward, to facilitate assembly of the fan 106. After the forces applied to the first side plate 1061 and the second side plate 1062 are removed, the first side plate 1061 elastically abuts against the first position 1011 of the housing 101, and the second side plate 1062 elastically abuts against the second position 1012 of the housing 101. In other words, elastic forces of the first side plate 1061 and the second side plate 1062 respectively press the first position 1011 and the second position 1012. In this way, after the fan 106 is installed and the forces are removed, the elastic forces of the first side plate 1061 and the second side plate 1062 can ensure that the first side plate 1061 and the second side plate 1062 are closely attached to the first position 1011 and the second position 1012 of the housing 101 respectively. Further, this ensures better sealing performance of the air outlet channel and better heat dissipation effect.

Figure 10A:
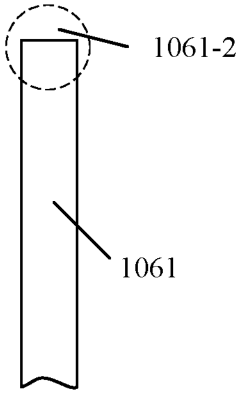
FIG. 10A, FIG. 10B, FIG. 10C, and FIG. 10D are schematic diagrams depicting structures of a second end of a first side plate according to this disclosure.
Figure 10B:
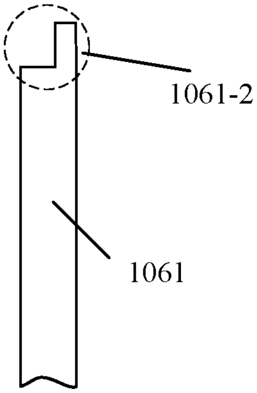
Figure 10C:
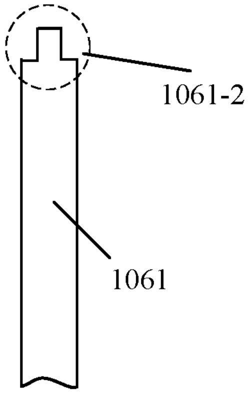
Figure 10D:
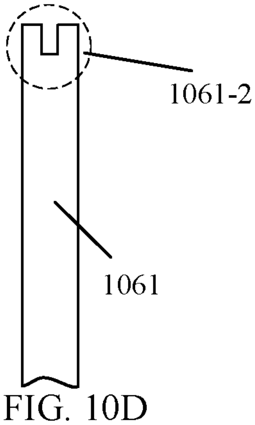

FIGS. 10A-10D are schematic diagrams depicting structures of the second end 1061-2 of the first side plate 1061 according to this disclosure. Refer to FIG. 10A. An end face at the second end 1061-2 of the first side plate 1061 is planar. Refer to FIG. 10B. The end face at the second end 1061-2 of the first side plate 1061 is non-planar. To be specific, a concave portion that faces the first end 1061-1 may be disposed at the second end 1061-2. Refer to FIG. 10C. The end face at the second end 1061-2 of the first side plate 1061 is non-planar. To be specific, a convex portion that is away from the first end 1061-1 may be disposed at the second end 1061-2. Refer to FIG. 10D. The end face at the second end 1061-2 of the first side plate 1061 is non-planar. To be specific, a concave portion that faces the first end 1061-1 may be disposed at the second end 1061-2.

It should be understood that the structures of the second end 1061-2 of the first side plate 1061 are used as an example in FIGS. 10A-10D. Structures of the second end 1062-2 of the second side plate 1062 are similar to the structures of the second end 1061-2 of the first side plate 1061, and details are not described herein.

It should be further understood that the structure of the second end 1061-2 of the first side plate 1061 may be different from the structure of the second end 1062-2 of the second side plate 1062. Correspondingly, different structures may be disposed at the first position 1011 and the second position 1012 of the housing 101 to fit the first side plate 1061 and the second side plate 1062 respectively. For details, refer to the following description.

It should be further understood that the structures of the second end 1061-2 of the first side plate 1061 shown in FIGS. 10A-10D are merely examples, and are not limited in this disclosure. The second end 1061-2 of the first side plate 1061 may alternatively be connected to the first position of the housing 101 by using another structure.

Figure 11:
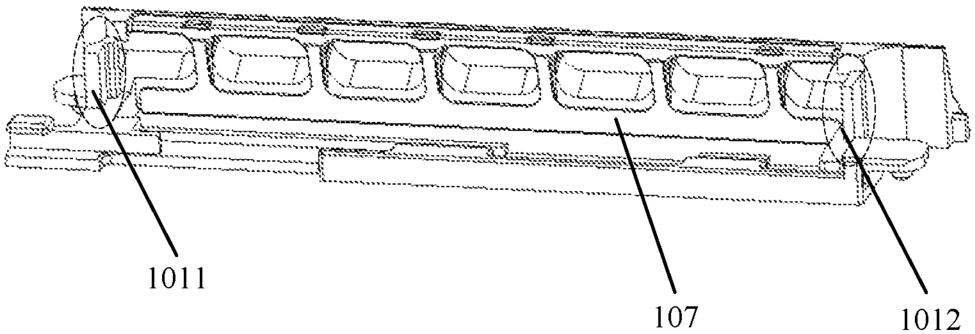
FIG. 11 is a schematic diagram depicting a structure of a side plate of a housing according to this disclosure.

In some embodiments of this disclosure, the first position 1011 and the second position 1012 of the housing 101 may be located at two ends on a side that is of the third side plate 107 of the housing 101 and that is close to the fan 105. FIG. 11 is a schematic diagram depicting a structure of the third side plate of the housing according to this disclosure. Refer to FIG. 11. The third side plate 107 includes the first position 1011 and the second position 1012. The first position 1011 and the second position 1012 are located at the two ends on the side that is of the third side plate 107 and that is close to the fan 106. The first position 1011 is connected to the second end 1061-2 of the first side plate 1061, and the second position 1012 is connected to the second end 1062-2 of the second side plate 1062. One or more air exhaust vents are provided between the first position 1011 and the second position 1012. To be specific, the first position 1011 and the second position 1012 are located at two ends on a side that is of the air exhaust vent of the housing 101 and that is close to the fan 106.

It should be understood that a structure of the first position 1011 corresponds to the second end 1061-2 of the first side plate 1061, and a structure of the second position 1012 corresponds to the second end 1062-1 of the second side plate 1062.

Still refer to FIG. 11. In some embodiments of this disclosure, convex portions may be disposed at the first position 1011 and the second position 1012 of the third side plate 107 respectively. A convex portion at the first position 1011 may fit the first side plate 1061, so as to be connected to each other. Similarly, a convex portion at the second position 1012 may fit the second side plate 1062, so as to be connected to each other.

FIGS. 12A-12F are schematic diagrams depicting structures of the first position and the second position of the housing according to this disclosure. Refer to FIGS. 12A-12D. Convex portions facing the fan 106 may be disposed at the first position 1011 and the second position 1012 respectively.

It should be understood that structures of the convex portions at the first position 1011 and the second position 1012 in FIGS. 12A-12D are merely examples, and are not limited in this disclosure.

Figure 12A:
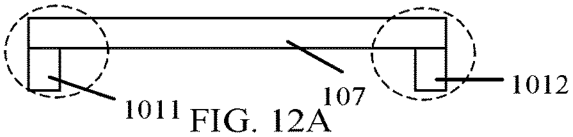
FIG. 12 is a schematic diagram depicting structures of a first position and a second position of the housing according to this disclosure.
Figure 12B:
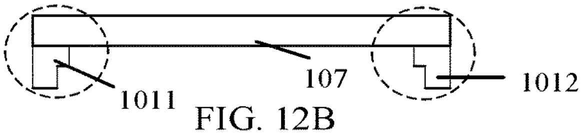
Figure 12C:
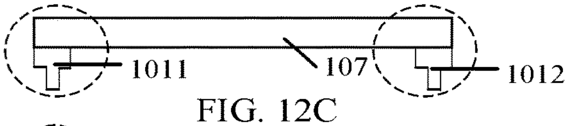
Figure 12D:
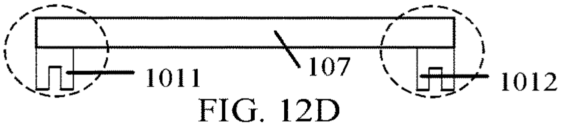
Figure 12E:
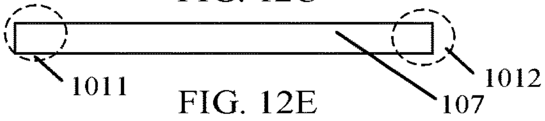

Refer to FIG. 12E. In some embodiments of this disclosure, no convex portion is disposed at the first position 1011 or the second position 1012.

Figure 12F:
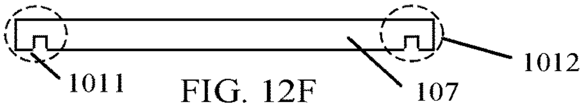

Refer to FIG. 12F. Concave portions may be disposed at the first position 1011 and the second position 1012 respectively.

Figure 13:
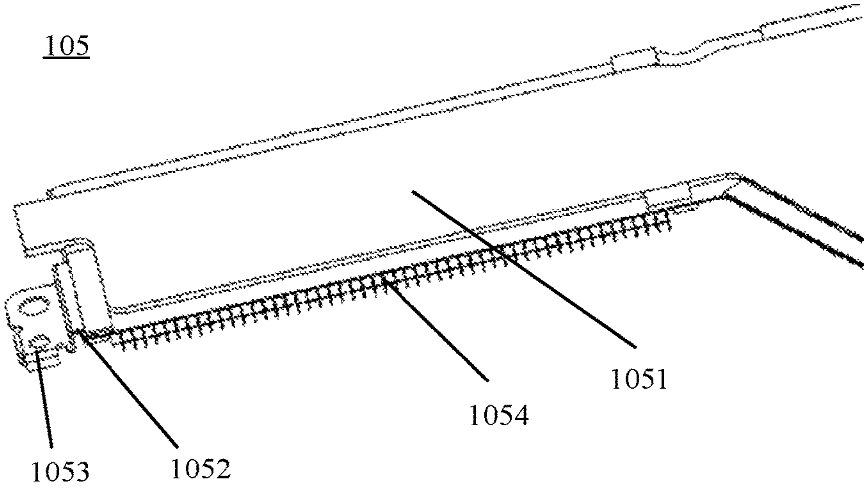
FIG. 13 is a schematic diagram depicting a structure of a heat dissipation assembly of an electronic device according to this disclosure.

FIG. 13 is a schematic diagram depicting a structure of the heat dissipation assembly according to this disclosure. Refer to FIG. 13. The heat dissipation assembly 105 includes a heat conducting pipe 1051, a connecting portion 1052, and a mounting end portion 1053. In some embodiments, the heat dissipation assembly 105 further includes a heat dissipation fin 1054. In some embodiments, the mounting end portion 1053 is provided with a through hole, and the heat dissipation assembly 105 is connected to the housing 101 through a bolt by using the through hole. The connecting portion 1052 connects the heat conducting pipe 1051 and the mounting end portion 1053. One end of the heat conducting pipe 1051 is connected to the heat emitting component, and the other end of the heat conducting pipe 1051 is connected to the first side plate and the second side plate through the connecting portion 1052 (refer to FIG. 6). For example, the connecting portion 1052 includes a fitting portion parallel to the first bottom plate, and a side that is of the fitting portion and that is away from the first bottom plate may abut against a side that is of the first side plate 1061 and that is close to the first bottom plate.

In some other embodiments, a filler is disposed between the side that is of the fitting portion and that is away from the first bottom plate and the side that is of the first side plate 1061 and that is close to the first bottom plate. For example, the filler includes two opposite end faces. One end face is attached to a surface of a side that is of the first side plate 1061 and that is close to the heat dissipation assembly 105. The other end face is attached to a surface of a side that is of the fitting portion of the connecting portion 1052 and that is close to the first side plate 1061. Similarly, a filler may also be disposed between the second side plate 1062 and the heat dissipation assembly 105. Details are not described herein.

The heat dissipation fin 1054 may be disposed on the heat conducting pipe 1051, and the heat dissipation fin 1054 may increase a contact area with air, which improves a heat dissipation capability. The heat conducting pipe 1051 may be made of a solid heat conducting material (such as copper). The heat conducting pipe 1051 may alternatively be a heat pipe, and the heat pipe may be a sealed pipe made of a heat conducting material (such as copper) that is partial vacuum. The heat pipe is filled with a working fluid. The working fluid may evaporate when the working fluid gets close to the heat emitting component (which may be referred to as an evaporation section). Under thermal diffusion, vapor is migrated to an end portion cooled by the fan. Heat is taken away by air, and therefore the vapor condenses into a liquid (or a condensation section). A porous material may be disposed inside the heat pipe, which may apply capillary effect to the condensate liquid, so that the liquid flows back to the evaporation section. The process is repeated in this way, so that heat generated in the electronic device is continuously transferred to a side close to the fan.

The following describes connection of components in this disclosure in detail with reference to FIG. 14A to FIG. 21B.

Figure 14A:
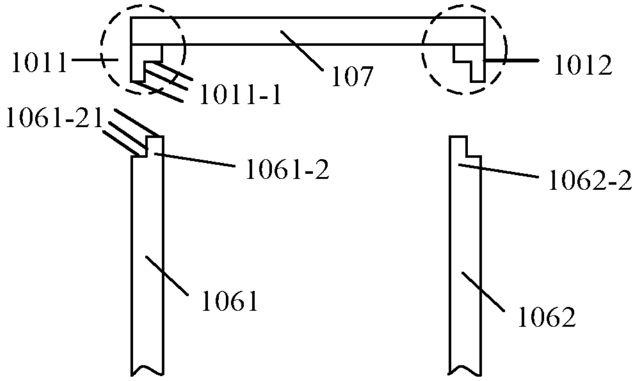
FIG. 14A and FIG. 14B are schematic diagrams depicting a structure of a type of fitting between a first side plate, a second side plate, and a housing of an electronic device according to this disclosure.
Figure 14B:
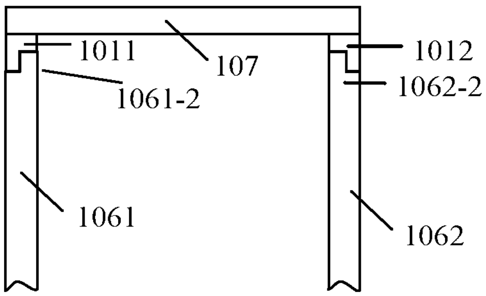

FIGS. 14A and 14B are schematic diagrams depicting a structure of a type of fitting between a first side plate, a second side plate, and a housing of an electronic device according to this disclosure. In some embodiments, the first position 1011 and the second position 1012 of the housing may be located at two ends on a side that is of the third side plate 107 of the housing and that is close to the fan. Refer to FIGS. 14A and 14B. A convex portion facing the fan may be disposed at the first position 1011, and a step-shaped first surface 1011-1 is formed on the housing. A concave portion corresponding to the convex portion at the first position 1011 is disposed at the second end 1061-2 of the corresponding first side plate 1061, and a second surface 1061-21 to be attached to the first surface 1011-1 of the housing is formed at the second end 1061-2 of the first side plate 1061, to connect the first side plate 1061 to the housing.

Further, in order to achieve better connection effect, in some embodiments of this disclosure, an adhesive layer may be disposed between the first surface 1011-1 of the housing and the second surface 1061-21 of the first side plate 1061, so that the first surface 1011-1 is bonded to the second surface 1061-21. The adhesive layer may be attached to each of the first surface 1011-1 and the second surface 1061-21, to seal a gap that may exist between the two surfaces.

It should be understood that bonding in this embodiment of this disclosure may also be referred to as adhesive bonding. An explanation of bonding of another surface in this disclosure is the same as the explanation herein.

In some other embodiments of this disclosure, the first surface 1011-1 of the housing may alternatively not be attached to the second surface 1061-21 of the first side plate 1061. However, such a maze structure may increase a distance for hot air to flow back to inside of the electronic device, which makes it more difficult for the hot air to flow back to the inside of the electronic device. This may also effectively provide a heat dissipation capability of the electronic device.

It should be noted that, for a description of connection between the second end 1062-2 of the second side plate 1062 and the second position 1012 of the housing, refer to a description of connection between the second end 1061-2 of the first side plate 1061 and the first position 1011 of the housing. Details are not described herein.

After the first side plate 1061 and the second side plate 1062 respectively connect the fan 106 to the first position 1011 and the second position 1012 of the housing 101 (refer to FIG. 7), an end of the heat dissipation assembly 105 may be further connected to the first side plate 1061 and the second side plate 1062 (refer to FIG. 6). In this way, the heat dissipation assembly 105 may cover sides that are the first side plate 1061 and the second side plate 1062 and that are close to the first bottom plate. After the heat dissipation assembly 105 is connected to the first side plate 1061 and the second side plate 1062, the first side plate 1061, the second side plate 1062, the housing 101, and the heat dissipation assembly 105 may enclose an air outlet channel. Because the first side plate 1061 and the second side plate 1062 are located on two sides of the air outlet channel, no gap may exist on the two sides of the air outlet channel. Therefore, no first side gap exists between the heat dissipation assembly 105 and the fan 106. Similarly, no second side gap exists between the heat dissipation assembly 105 and the third side plate 107 of the housing 101. In other words, the side gap between the fan 106 and the heat dissipation assembly 105 and the side gap between the heat dissipation assembly 105 and the third side plate 107 of the housing 101 are sealed by adding the first side plate 1061 and the second side plate 1062 to the electronic device. After the heat dissipation assembly 105 is connected to the first side plate 1061 and the second side plate 1062, the first side plate 1061, the second side plate 1062, the heat dissipation assembly 104, and the housing 101 may enclose the air outlet channel. Two ends of the air outlet channel may respectively communicate with the air outlet of the fan 106 and the air exhaust vent of the housing 101.

Figure 15:
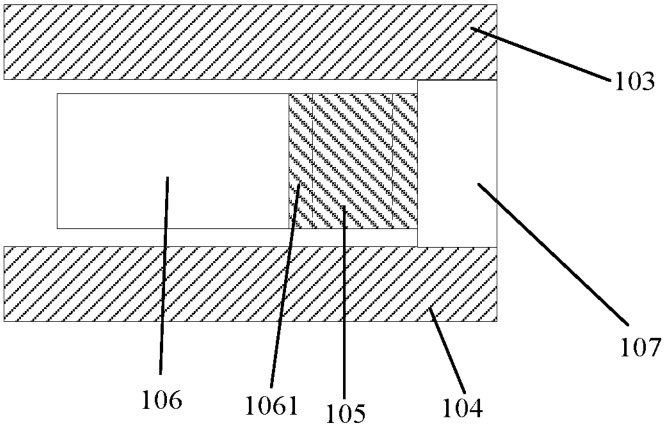
FIG. 15 is a schematic side view of an internal structure of an electronic device according to this disclosure.
Figure 16:
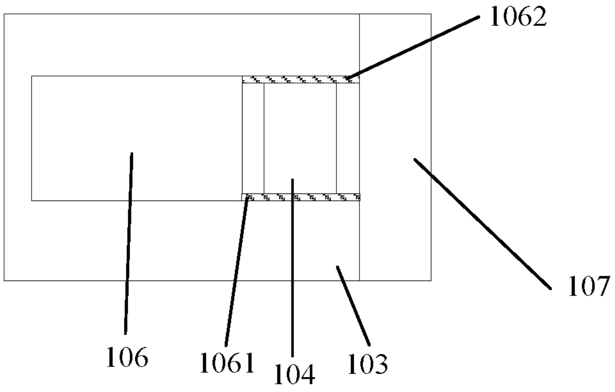
FIG. 16 is a schematic top view of an internal structure of an electronic device according to this disclosure.

FIG. 15 is a schematic side view of an internal structure of the electronic device according to this disclosure, and FIG. 16 is a schematic top view of the internal structure of the electronic device according to this disclosure. Refer to FIG. 15 and FIG. 16. After the first side plate 1061 and the second side plate 1062 are added to the electronic device, the first side gap and the second side gap may be sealed.

In some embodiments of this disclosure, fillers may be disposed on two sides that are of the heat dissipation apparatus and that are close to the housing, and the fillers may cover gaps, other than side gaps, of the heat dissipation apparatus.

Figure 17:
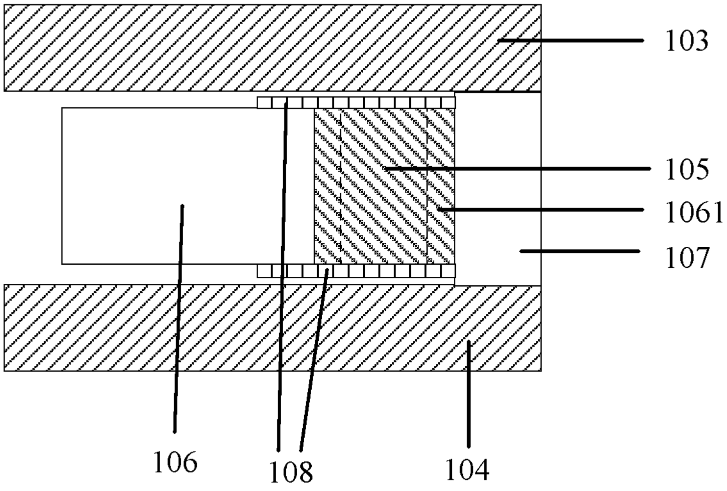
FIG. 17 is a schematic side view of an internal structure of an electronic device according to this disclosure.
Figure 18:
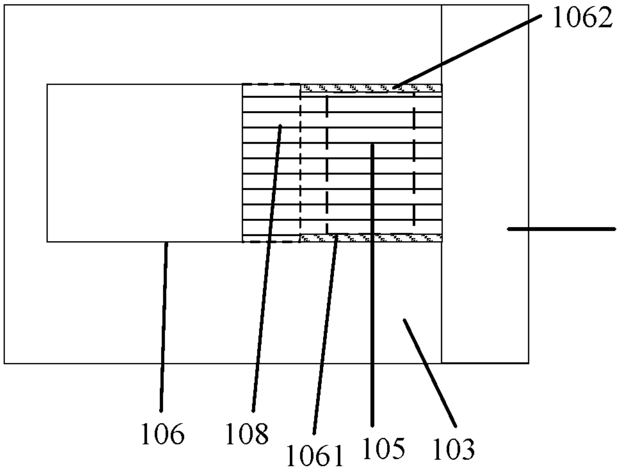
FIG. 18 is a schematic top view of an internal structure of an electronic device according to this disclosure.

FIG. 17 is a schematic side view of an internal structure of the electronic device according to this disclosure, and FIG. 18 is a schematic top view of the internal structure of the electronic device according to this disclosure. Refer to FIG. 17 and FIG. 18. The fillers 108 are disposed on the two sides that are of the heat dissipation apparatus and that are close to the housing of the electronic device. The fillers 108 may fill gaps, other than the side gaps, of the heat dissipation apparatus. The filler 108 includes two opposite end faces. One end face is attached to the heat dissipation apparatus to seal a possible gap, and the other end face may not be in contact with the housing 101. In some other embodiments, for the two opposite end faces of the filler 108, one end face is attached to the heat dissipation apparatus to seal a possible gap, and the other end face abuts against the housing 101.

For example, the filler 108 may be an elastic material such as silica gel or filler foam.

In this disclosure, the first side plate and the second side plate are added to seal side gaps of the heat dissipation apparatus. Then, fillers are disposed between the heat dissipation apparatus and the housing, so that the first side plate, the second side plate, the heat dissipation assembly, and the housing can form a sealed air outlet channel. This prevents air backflow, improves a heat dissipation capability of the electronic device, and improves a running speed of the electronic device. In addition, costs of adding the first side plate and the second side plate are low, and installation difficulty is not increased.

Figure 19A:
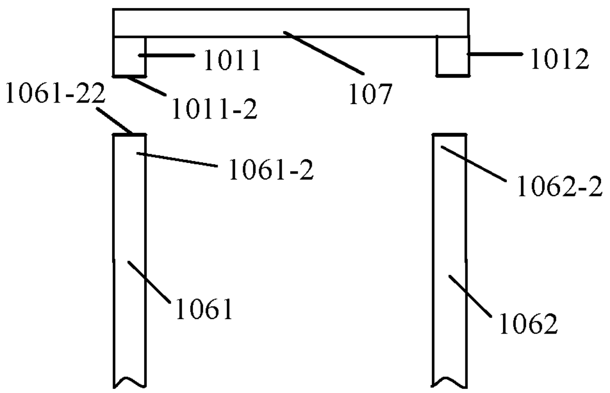
FIG. 19A and FIG. 19B are schematic diagrams depicting a structure of another type of fitting between a first side plate, a second side plate, and a housing of an electronic device according to this disclosure.
Figure 19B:
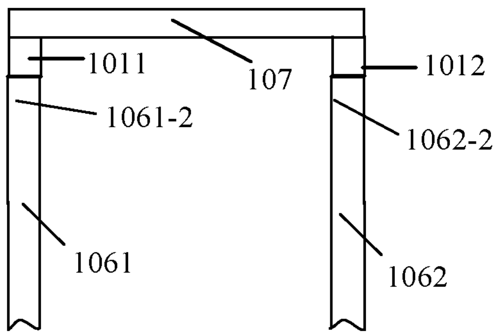

FIGS. 19A and 19B are schematic diagrams depicting a structure of another type of fitting between a first side plate, a second side plate, and a housing of an electronic device according to this disclosure. In some embodiments, the first position 1011 and the second position 1012 of the housing may be located at two ends on a side that is of the third side plate 107 of the housing and that is close to the fan. Refer to FIGS. 19A and 19B. A convex portion facing the fan may be disposed at the first position 1011, and a third surface 1011-2 is formed on the housing, where the third surface 1011-2 may be planar. In this case, a fourth surface 1061-22 to be attached to the third surface 1011-2 of the housing is formed at the second end 1061-2 of the corresponding first side plate 1061, to connect the first side plate 1061 to the housing.

Further, in order to achieve better connection effect, in some embodiments of this disclosure, an adhesive layer may be disposed between the third surface 1011-2 of the housing and the fourth surface 1061-22 of the first side plate 1061, so that the first side plate 1061 is bonded to the housing. The adhesive layer may be attached to each of the third surface 1011-2 and the fourth surface 1061-22, to seal a gap that may exist between the two surfaces. For example, the third surface 1011-2 and the fourth surface 1061-22 may be planar.

Optionally, in some embodiments, in order to better connect the second end 1061-2 of the first side plate 1061 to the first position 1011 of the housing, an area of the third surface 1011-2 of the housing is larger than an area of the fourth surface 1061-22 of the first side plate.

It should be noted that, for a description of connection between the second end 1062-2 of the second side plate 1062 and the second position 1012 of the housing, refer to a description of connection between the second end 1061-2 of the first side plate 1061 and the first position 1011 of the housing. Details are not described herein.

For a description of connection between the heat dissipation assembly 105 and each of the first side plate 1061 and the second side plate 1062, refer to the foregoing embodiments. Details are not described herein.

For a description of disposing fillers on two sides that are of the heat dissipation apparatus and that are close to the housing, refer to the foregoing embodiments. Details are not described herein.

In this disclosure, the first side plate and the second side plate are added to seal side gaps of the heat dissipation apparatus. Then, fillers are disposed between the heat dissipation apparatus and the housing, so that the first side plate, the second side plate, the heat dissipation assembly, and the housing can form a sealed air outlet channel. This prevents air backflow, improves a heat dissipation capability of the electronic device, and improves a running speed of the electronic device. In addition, costs of adding the first side plate and the second side plate are low, and installation difficulty is not increased.

Figure 20A:
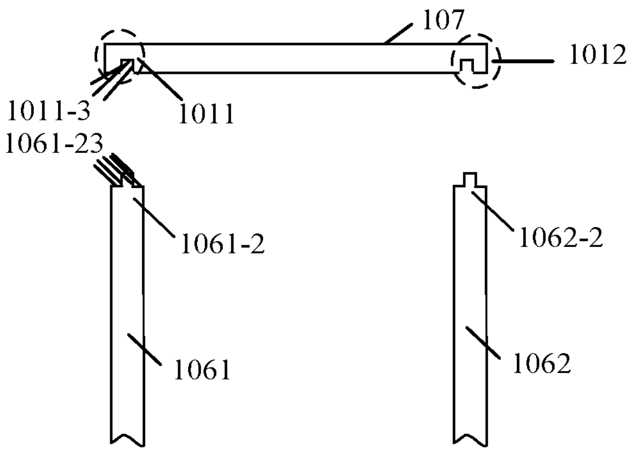
FIG. 20A and FIG. 20B are schematic diagrams depicting a structure of another type of fitting between a first side plate, a second side plate, and a housing of an electronic device according to this disclosure.
Figure 20B:
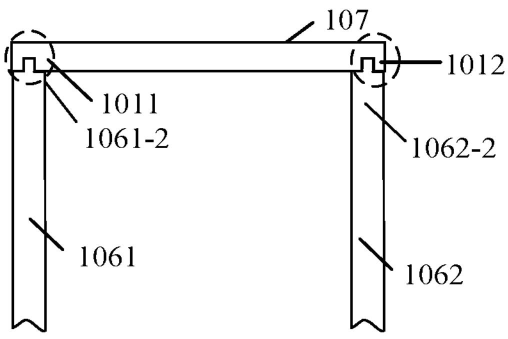

FIGS. 20A and 20B are schematic diagrams depicting a structure of another type of fitting between a first side plate, a second side plate, and a housing of an electronic device according to this disclosure. In some embodiments, the first position 1011 and the second position 1012 of the housing may be located at two ends on a side that is of the third side plate 107 of the housing and that is close to the fan. Refer to FIGS. 20A and 20B. A concave portion may be disposed at the first position 1011, and a fifth surface 1011-3 is formed on the housing. A convex portion fitting the concave portion at the first position 1011 may be disposed at the second end 1061-2 of the corresponding first side plate 1061, and a sixth surface 1061-23 to be attached to the fifth surface 1011-3 is formed at the second end 1061-2 of the first side plate 1061. The convex portion at the second end 1061-2 of the first side plate 1061 is inserted into the concave portion at the first position 1011 of the housing, so as to be connected to each other.

Further, in order to achieve better connection effect, in some embodiments of this disclosure, an adhesive layer may be disposed between the fifth surface 1011-3 of the housing and the sixth surface 1061-23 of the first side plate 1061, so that the first side plate 1061 is bonded to the housing. The adhesive layer may be attached to each of the fifth surface 1011-3 and the sixth surface 1061-23, to seal a gap that may exist between the two surfaces.

For a description of connection between the heat dissipation assembly 105 and each of the first side plate 1061 and the second side plate 1062, refer to the foregoing embodiments. Details are not described herein.

For a description of disposing fillers on two sides that are of the heat dissipation apparatus and that are close to the housing, refer to the foregoing embodiments. Details are not described herein.

In this disclosure, the first side plate and the second side plate are added to seal the side gaps of the heat dissipation apparatus. Then, fillers are disposed between the heat dissipation apparatus and the housing, so that the first side plate, the second side plate, the heat dissipation assembly, and the housing can form a sealed air outlet channel. This prevents air backflow, improves a heat dissipation capability of the electronic device, and improves a running speed of the electronic device. In addition, costs of adding the first side plate and the second side plate are low, and installation difficulty is not increased.

Figure 21A:
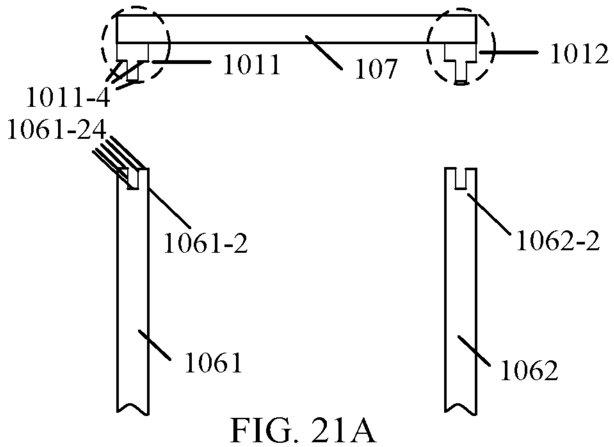
FIG. 21A and FIG. 21B are schematic diagrams depicting a structure of another type of fitting between a first side plate, a second side plate, and a housing of an electronic device according to this disclosure.
Figure 21B:
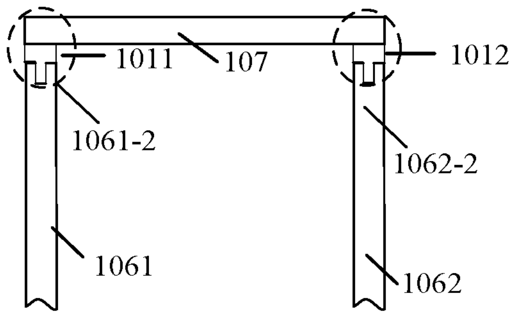

FIGS. 21A and 21B are schematic diagrams depicting a structure of another type of fitting between a first side plate, a second side plate, and a housing of an electronic device according to this disclosure. In some embodiments, the first position 1011 and the second position 1012 of the housing may be located at two ends on a side that is of the third side plate 107 of the housing and that is close to the fan. Refer to FIGS. 21A and 21B. A convex portion facing the fan may be disposed at the first position 1011, and a seventh surface 1011-4 is formed on the housing. A concave portion fitting the convex portion at the first position 1011 may be disposed at the second end of the corresponding first side plate 1061, and an eighth surface 1061-24 to be attached to the seventh surface 1011-4 is formed at the second end 1061-2 of the first side plate 1061. The convex portion at the first position 1011 of the housing 101 is inserted into the concave portion at the second end 1061-2 of the first side plate 1061, so as to be connected to each other.

Further, in order to achieve better connection effect, in some embodiments, an adhesive layer may be disposed between the seventh surface 1011-4 of the housing 101 and the eighth surface 1061-24 of the first side plate 1061, so that the first side plate 1061 is bonded to the housing 101. The adhesive layer may be attached to each of the seventh surface 1011-4 and the eighth surface 1061-24, to seal a gap that may exist between the two surfaces.

For a description of connection between the heat dissipation assembly and each of the first side plate 1061 and the second side plate 1062, refer to the foregoing embodiments. Details are not described herein.

For a description of disposing fillers on two sides that are of the heat dissipation apparatus and that are close to the housing, refer to the foregoing embodiments. Details are not described herein.

In this disclosure, the first side plate and the second side plate are added to seal side gaps of the heat dissipation apparatus. Then, fillers are disposed between the heat dissipation apparatus and the housing, to form a sealed air outlet channel. This prevents air backflow, improves a heat dissipation capability of the electronic device, and improves a running speed of the electronic device. In addition, costs of adding the first side plate and the second side plate are low, and installation difficulty is not increased.

It should be understood that structures of the components of the electronic device and the connection relationships between the components in FIG. 4 to FIG. 18B are merely example descriptions, and a structure of any replaceable component that has a same function as each component falls within the protection scope of embodiments of this disclosure.

It should be understood that in embodiments of this disclosure, unless otherwise specified and limited, terms such as "connection" and "fastened connection" should be understood in a broad sense. For a person of ordinary skill in the art, specific meanings of the foregoing terms in embodiments of this disclosure may be understood based on a specific situation.

For example, the "connection" may be implemented in various connection manners such as a fastened connection, a rotatable connection, a flexible connection, a movable connection, and integrally forming. The connection may be a direct connection, may be an indirect connection implemented by using an intermediate medium, or may be a connection inside two components or an interaction relationship between the two components.

For example, one component may be directly or indirectly fastened to another component to implement "fastened connection". The fastened connection may be implemented in manners such as a mechanical connection, welding, and bonding. The mechanical connection may be implemented in manners such as a rivet connection, a bolt connection, a threaded connection, a key pin connection, a buckle connection, a latching connection, and insertion. The bonding may be implemented in manners such as adhesive bonding and solvent bonding.

It should be further understood that "parallel" or "perpendicular" in embodiments of this disclosure may be understood as "approximately parallel" or "approximately perpendicular".

In addition, a direction or a position relationship indicated by a term such as "length", "width", "thickness", "up", "down", "front", or "rear" is a direction or a position relationship shown based on the accompanying drawings, and is merely for ease of describing this disclosure and simplifying the description, but does not indicate or imply that an indicated apparatus or component needs to have a specific orientation or needs to be constructed and operated in the specific orientation. Therefore, such a term cannot be understood as a limitation on this utility model.

It should be noted that the terms "first" and "second" are merely intended for a purpose of description, and shall not be understood as an indication or implication of relative importance or implicit indication of a quantity of indicated technical features. A feature limited by "first" and "second" may explicitly or implicitly include one or more features.

In embodiments of this disclosure, "a plurality of" means two or more. The term "and/or" describes an association relationship between associated objects, and indicates that three relationships may exist. For example, A and/or B may indicate the following cases: only A exists, both A and B exist, and only B exists, where A and B may be singular or plural. The character "/" generally indicates an "or" relationship between the associated objects.

The foregoing descriptions are merely specific implementations of this disclosure, but the protection scope of this disclosure is not limited thereto. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. An electronic device comprising:
- a housing comprising:
  - a first position;
  - a second position; and
  - a first air exhaust vent provided between the first position and the second position;
- a fan disposed in the housing and comprising:
  - a second air exhaust vent comprising:
    - a first side; and
    - a second side located opposite to the first side;
  - a first side plate comprising:
    - a first end coupled to the first side; and
    - a second end bonded to the housing at the first position; and
  - a second side plate comprising:
    - a third end coupled to the second side; and
    - a fourth end bonded to the housing at the second position;
- a heat emitting component disposed in the housing;
- a heat dissipation component disposed in the housing and comprising:
  - a fifth end coupled to the heat emitting component; and
  - a sixth end; and
- a sealed air exhaust vent channel enclosed by the first side plate, the second side plate, the sixth end, and the housing and configured to couple the second air exhaust vent and the first air exhaust vent, so that the sealed air exhaust vent channel prevents air backflow to an interior of the electronic device.

2. The electronic device of claim 1, wherein the housing further comprises:
- a first convex portion disposed at the first position and facing the fan; and
- a second convex portion disposed at the second position and facing the fan,
- wherein the first side plate further comprises a first concave portion corresponding to the first convex portion and is disposed at the second end, and
- wherein the second side plate further comprises a second concave portion corresponding to the second convex portion and is disposed at the fourth end.

3. The electronic device of claim 2, wherein the heat dissipation component further comprises a seventh end proximate to the first side plate and the second side plate and configured to abut against the first side plate and the second side plate.

4. The electronic device of claim 2, wherein the fan and the housing form a first gap, wherein the heat dissipation component and the housing form a second gap, and wherein the electronic device further comprises:

a first filler disposed in the first gap; and a second filler disposed in the second gap.

5. The electronic device of claim 2, wherein the first side plate and the second side plate are made out of elastic materials, wherein the first side plate is configured to elastically abut against the housing at the first position, and wherein the second side plate is configured to elastically abut against the housing at the second position.

6. The electronic device of claim 2, wherein the fan and the housing form a first gap, wherein the heat dissipation component and the housing form a second gap, and wherein the electronic device further comprises:

a first filler disposed in the first gap; and a second filler disposed in the second gap.

7. The electronic device of claim 1, wherein the housing further comprises:

a first concave portion disposed at the first position; and a second concave portion disposed at the second position, wherein the first side plate further comprises a first convex portion corresponding to the first concave portion and disposed at the second end, and wherein the second side plate further comprises a second convex portion corresponding to the second concave portion and disposed at the fourth end.

8. The electronic device of claim 7, wherein the second end is bonded to the housing at the first position, and wherein the fourth end is bonded to the housing at the second position.

9. The electronic device of claim 7, wherein the heat dissipation component further comprises a seventh end proximate to the first side plate and the second side plate and configured to abut against the first side plate and the second side plate.

10. The electronic device of claim 7, wherein the fan and the housing form a first gap, wherein the heat dissipation component and the housing form a second gap, and wherein the electronic device further comprises:

a first filler disposed in the first gap; and a second filler disposed in the second gap.

11. The electronic device of claim 1, wherein the fan and the housing form a first gap, wherein the heat dissipation component and the housing form a second gap, and wherein the electronic device further comprises:

a first filler disposed in the first gap; and a second filler disposed in the second gap.

12. The electronic device of claim 1, wherein the heat dissipation component further comprises a seventh end proximate to the first side plate and the second side plate and configured to abut against the first side plate and the second side plate.

13. The electronic device of claim 1, wherein the fan and the housing form a first gap, wherein the heat dissipation component and the housing form a second gap, and wherein the electronic device further comprises:

a first filler disposed in the first gap; and a second filler disposed in the second gap.

14. The electronic device of claim 13, wherein the first filler comprises:

a first end face in a first sealing fit with the fan; and a second end face located opposite to the first end face, and wherein the second filler comprises:

a third end face in a second sealing fit with the heat dissipation component; and a fourth end face located opposite to the third end face.

15. The electronic device of claim 14, wherein the second end face and the fourth end face are configured to abut against the housing.

16. The electronic device of claim 13, wherein the first filler and the second filler are made out of elastic materials.

17. The electronic device of claim 1, wherein the first side plate and the second side plate are made out of elastic materials, wherein the first side plate is configured to elastically abut against the housing at the first position, and wherein the second side plate is configured to elastically abut against the housing at the second position.

18. An electronic device comprising:

a housing comprising:

a first position;

a second position; and a first air exhaust vent provided between the first position and the second position;

a fan disposed in the housing and comprising:

a second air exhaust vent comprising:

a first side plate disposed on a first side of the fan, wherein the first side plate extends from the second air exhaust vent toward the housing and terminate at the first position; and a second side plate disposed on a second side of the fan opposite to the first side, wherein the second side plate extends from the second air exhaust vent toward the housing and terminates at the second position;

a heat emitting component disposed in the housing;

a heat dissipation component disposed in the housing and coupled to the heat emitting component; and a sealed air exhaust vent channel enclosed by the first side plate, the second side plate, the heat dissipation component, and the housing and configured to guide airflow from the second air exhaust vent directly to the first air exhaust vent so that air backflow to an interior of the electronic device is prevented.

19. An electronic device comprising:

a housing comprising:

a first position;

a second position; and a first air exhaust vent provided between the first position and the second position;

a fan disposed in the housing and comprising:

a second air exhaust vent comprising:

a first side; and a second side located opposite to the first side;

a first side plate comprising:

a first end coupled to the first side; and a second end bonded to the housing at the first position to form a first bonded interface; and a second side plate comprising:

a third end coupled to the second side; and a fourth end bonded to the housing at the second position to form a second bonded interface;

a heat dissipation component disposed adjacent to the first side plate and the second side plate;

a sealing material disposed at the first bonded interface and the second bonded interface; and a sealed air exhaust vent channel enclosed by the first side plate, the second side plate, the heat dissipation component, and the housing, wherein the sealed air exhaust vent channel extends from the second air exhaust vent to the first air exhaust vent so as to prevent air backflow to an interior of the electronic device.

20. The electronic device of claim 19, wherein the sealing material comprises:

a first elastic filler disposed between the first side plate and the housing; and a second elastic filler disposed between the second side plate and the housing.

* * * * *